(12) United States Patent
Stewart et al.

(10) Patent No.: US 7,932,743 B1
(45) Date of Patent: Apr. 26, 2011

(54) SEQUENTIALLY CONFIGURABLE PROGRAMMABLE INTEGRATED CIRCUIT

(75) Inventors: Rodney Stewart, Killarney (IE); Michael Huebner, Karlsruhe (DE); Juan J. Noguera Serra, Dublin (IE); Robert P. Esser, Los Gatos, CA (US); Jurgen Becker, Jockgrim (DE); Oliver Sander, Karlsruhe (DE); Matthias Traub, Tubingen (DE); Joachim H. Meyer, Karlsruhe (DE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/699,703

(22) Filed: Feb. 3, 2010

(51) Int. Cl.
H03K 19/173 (2006.01)
H01L 25/00 (2006.01)

(52) U.S. Cl. .......................... 326/38; 326/47

(58) Field of Classification Search .............. 326/38–41, 326/46, 47
See application file for complete search history.

(56) References Cited

U.S. PATENT DOCUMENTS

| | | | |
|---|---|---|---|
| 5,778,439 A | 7/1998 | Trimberger et al. | |
| 6,094,063 A * | 7/2000 | St. Pierre et al. | 326/37 |
| 6,366,117 B1 | 4/2002 | Pang et al. | |
| 6,429,682 B1 | 8/2002 | Schultz et al. | |
| 6,573,748 B1 * | 6/2003 | Trimberger | 326/38 |
| 7,420,392 B2 | 9/2008 | Schultz et al. | |
| 7,425,843 B1 | 9/2008 | Edwards et al. | |
| 7,509,617 B1 | 3/2009 | Young | |

OTHER PUBLICATIONS

U.S. Appl. No. 12/891,578, filed Sep. 27, 2010, Jenkins, IV.
Alfke, Peter et al., *XC3000 Series Technical Information*, XAPP024 (v1.0), Nov. 24, 1997, pp. 13-19 to 13-29, Xilinx, Inc., San Jose, California, USA.
Carmichael, Carl et al., *Correcting Single-Event Upsets Through Virtex Partial Configuration*, XAPP216 (v1.0), Jun. 1, 2000, pp. 1-12, Xilinx, Inc., San Jose, California, USA.
Lim, Davin et al., *Two Flows for Partial Reconfiguration: Module Based or Small Bit Manipulations*, XAPP290 (v1.0), May 17, 2002, pp. 1-23, Xilinx, Inc., San Jose, California, USA.
Pashram, Vikram et al., *High-Speed DES and Triple DES Encryptp/Decryptor*, XAPP270 (v1.0), Aug. 3, 2001, pp. 1-12, Xilinx, Inc., San Jose, California, USA.
Xilinx, Inc., *Virtex-4 Configuration Guide*, UG071, copyright 1994, pp. 1-108, Xilinx, Inc., San Jose, California, USA.
Xilinx, Inc., *Virtex-4 Configuration Guide*, UG071 (v1.1), Sep. 10, 2004, pp. 1-108, Xilinx, Inc., San Jose, California, USA.
Xilinx, Inc., *Two Flows for Partial Reconfiguration: Module Based or Difference Based*, XAPP290 (v1.2), Sep. 9, 2004, pp. 1-28, Xilinx, Inc., San Jose, California, USA.

(Continued)

*Primary Examiner* — Daniel D Chang (74) *Attorney, Agent, or Firm* — Kenneth Glass; LeRoy D. Maunu; Lois D. Cartier (57) ABSTRACT

A programmable integrated circuit performs an initial partial configuration of the programmable integrated circuit in response to receiving an activation signal. In this way, the programmable integrated circuit enables an initial functionality of the programmable integrated circuit. The programmable integrated circuit then performs a subsequent partial configuration of the programmable integrated circuit for enabling additional functionality of the programmable integrated circuit. In some embodiments, the programmable integrated circuit receives an input signal indicating a stimulus in an environment of the programmable integrated circuit and determines based on the input signal whether to perform the subsequent partial configuration of the programmable integrated circuit or generate a power down signal for powering down the programmable integrated circuit without performing the subsequent partial configuration. In some embodiments, the programmable integrated circuit performs a sequence of partial subsequent configurations for enabling a sequence of additional functionalities of the programmable integrated circuit.

23 Claims, 6 Drawing Sheets

OTHER PUBLICATIONS

Lysaght, Patrick et al., "Invited Paper: Enhanced Architectures, Design Methodologies and CAD Tools for Dynamic Reconfiguration of Xilinx FPGAs," *Proc. of the 2006 International Conference on Field Programmable Logic and Applications*, Aug. 28, 2006, pp. 1-6, IEEE, Piscataway, New Jersey, USA.

U.S. Appl. No. 12/544,483, filed Aug. 20, 2009, McAndrew et al.

* cited by examiner

SEQUENTIALLY CONFIGURABLE PROGRAMMABLE INTEGRATED CIRCUIT

FIELD OF THE INVENTION

The invention relates to integrated circuits. More particularly, the invention relates to programmable integrated circuits.

BACKGROUND

An electronic system often includes a programmable integrated circuit such as a programmable logic device for customizing operation of the electronic system for a particular application. In one type of electronic system including a programmable logic device, the programmable logic device is powered up and configured during operation of the electronic system. In this process, the programmable logic device reads configuration data from a memory device upon power up and configures functionality of the programmable logic device based on the configuration data. In this type of electronic system, the functionality of the programmable logic device is not enabled until the programmable logic device is fully configured. Because the time required for configuring the programmable logic device may be lengthy, the functionality of the programmable logic device is not available in the electronic system for a considerable time after power up of the programmable logic device. Moreover, the programmable logic device consumes a considerable amount of power in the electronic system.

In another type of electronic system, a programmable integrated circuit such as a programmable logic device is initially configured to enable an initial functionality of the programmable logic device. Portions of the programmable logic device are then selectively reconfigured during operation of the electronic system to modify the initial functionality of the programmable logic device. In this type of electronic system, the initial functionality of the programmable logic device is not enabled until the programmable logic device is fully configured. As a result, the initial functionality of the programmable device is not available for a considerable time after power up of the programmable logic device. Moreover, the programmable logic device consumes a considerable amount of power in the electronic system.

In light of the above, a need exists for reducing the time required for configuring a programmable integrated circuit to enable functionality of the programmable circuitry. A further need exists for reducing power consumption of a programmable integrated circuit.

SUMMARY

In various embodiments, a programmable integrated circuit configures an initial application module of the programmable integrated circuit in response to an activation signal (e.g., in response to powering-up an electronic system). In this way, the programmable integrated circuit performs an initial partial configuration of the programmable integrated circuit to enable an initial functionality of the programmable integrated circuit. The programmable integrated circuit then performs a subsequent partial configuration of the programmable integrated circuit to enable additional functionality of the programmable integrated circuit. Because the initial functionality of the programmable integrated circuit is enabled before the additional functionality of the programmable integrated circuit is enabled, the programmable integrated circuit is operational and may respond to an input signal sooner than a programmable integrated circuit that is not operational until fully configured. In this way, a response time of the programmable integrated circuit is reduced.

In some embodiments, the programmable integrated circuit receives an input signal indicating a stimulus in an environment of the programmable integrated circuit and determines based on the input signal whether to perform the subsequent partial configuration of the programmable integrated circuit or generate a power down signal for powering down the programmable integrated circuit without performing the subsequent partial configuration. In this way, power consumption is reduced in the programmable integrated circuit.

A programmable integrated circuit, in accordance with one embodiment, includes programmable tiles and a configuration module coupled to the programmable tiles. The configuration module is configured to perform an initial partial configuration of the programmable tiles in response to a programmable integrated circuit activation signal received at the programmable integrated circuit. The initial partial configuration forms an initial application module of the programmable integrated circuit. Moreover, the initial application module has an initial functionality of the programmable integrated circuit for responding to an input signal received by the programmable integrated circuit and is operational upon completion of the initial partial configuration. In a further embodiment, the programmable integrated circuit is a programmable logic device.

An electronic system, in accordance with one embodiment, includes a programmable integrated circuit, a low current circuit, and a programmable integrated circuit power controller. The programmable integrated circuit includes programmable tiles and a configuration module coupled to the programmable tiles. The configuration module is configured to perform an initial partial configuration of the programmable tiles in response to a programmable integrated circuit activation signal received at the programmable integrated circuit. The initial partial configuration forms an initial application module of the programmable integrated circuit. Moreover, the initial application module has an initial functionality of the programmable integrated circuit for responding to an input signal received by the programmable integrated circuit and is operational upon completion of the initial partial configuration. The low current circuit is configured to receive a stimulus and generate a power activation signal based on the stimulus. The programmable integrated circuit power controller is coupled to the low current circuit and is configured to generate the programmable integrated circuit activation signal in response to receiving the power activation signal. In a further embodiment, the programmable integrated circuit is a programmable logic device.

A method, in accordance with one embodiment, includes receiving a programmable integrated circuit power signal at a programmable integrated circuit and performing an initial partial configuration of the programmable integrated circuit in response to the programmable integrated circuit activation signal. In this way, an initial functionality is provided to the programmable integrated circuit. The method also includes performing a subsequent partial configuration of the programmable integrated circuit for providing an additional functionality of the programmable integrated circuit after performing the initial partial configuration. In a further embodiment, the programmable integrated circuit is a programmable logic device.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

The present invention is applicable to a variety of programmable integrated circuits (ICs). An appreciation of the present invention is now presented by way of specific examples utilizing programmable logic devices (PLDs). An exemplary type of programmable logic device that can be used to implement the invention is the field programmable gate array (FPGA). However, the present invention is not limited by these examples, but can be applied to many different types of programmable integrated circuits.

In various embodiments, a programmable IC performs an initial partial configuration of the programmable IC in response to receiving an activation signal. In this way, the programmable IC enables an initial functionality of the programmable IC. The programmable IC then performs a subsequent partial configuration of the programmable IC for enabling additional functionality of the programmable IC. In some embodiments, the programmable IC receives an input signal indicating a stimulus occurring in an environment of the programmable IC. In these embodiments, the programmable IC determines based on the input signal whether to perform the subsequent partial configuration of the programmable IC or generate a power down signal for powering down the programmable IC without performing the subsequent partial configuration. In some embodiments, the programmable IC configures one or more (e.g., a sequence) of subsequent applications modules for enabling one or more additional functionalities of the programmable IC.

In some embodiments, the initial partial configuration and the subsequent configurations are performed using data from a single configuration bitstream for the programmable integrated circuit. In other embodiments, the initial partial configuration bitstream is included in a first configuration bitstream and the subsequent configuration(s) are included in one or more additional configuration bitstreams.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
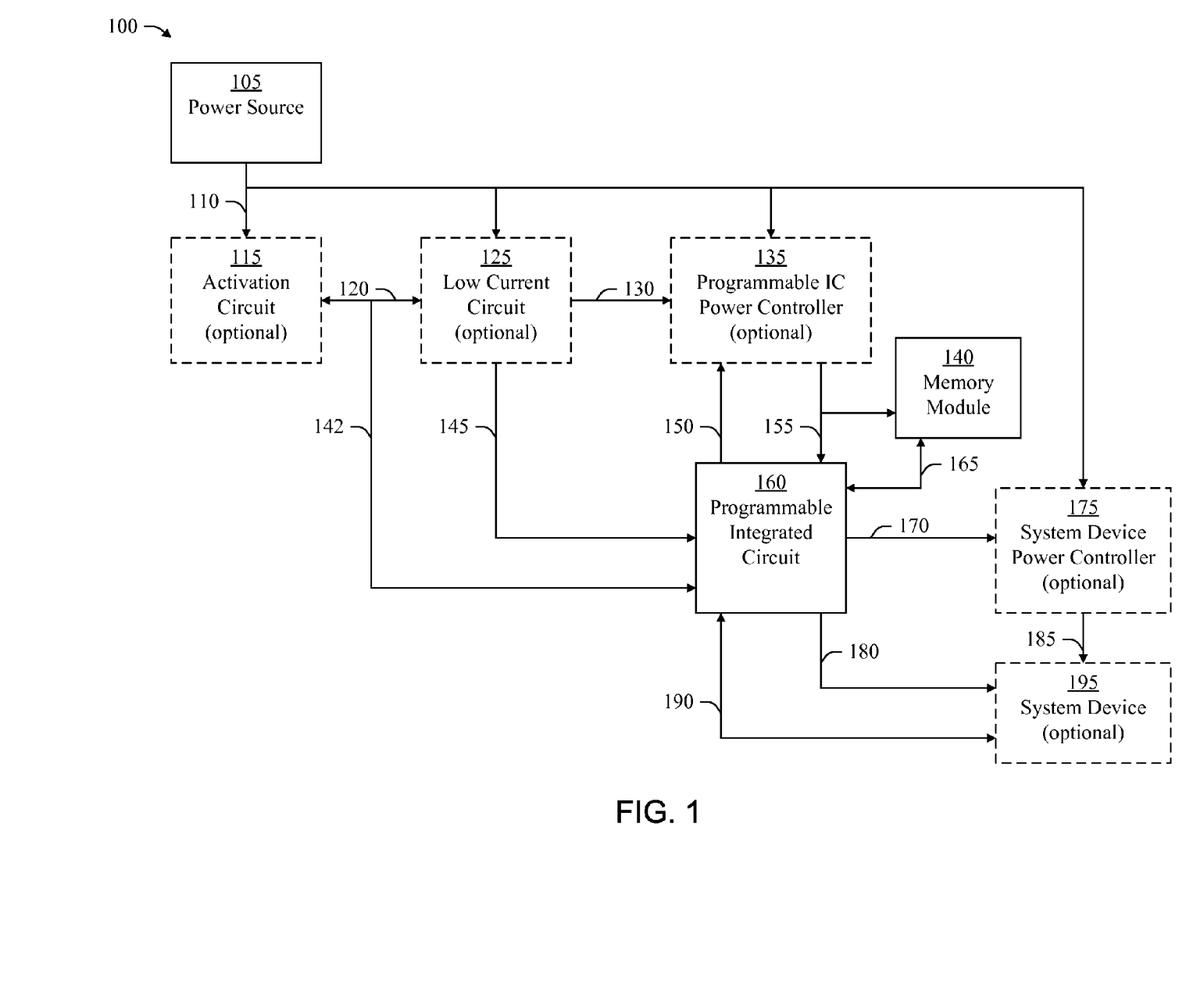
FIG. 1 is a block diagram of an electronic system, in accordance with an embodiment of the present invention.

FIG. 1 is a block diagram of an electronic system 100, in accordance with an embodiment of the present invention. The electronic system 100 includes a power source 105, an optional activation circuit 115, an optional communication interface 120, an optional low current circuit 125, an optional programmable IC power controller 135, a memory module 140, a programmable IC 160, a memory bus 165, an optional system device power controller 175, an optional communication link 190, and an optional system device 195. The power source 105 is coupled (e.g., connected) to the activation circuit 115, the low current circuit 125, the programmable IC power controller 135, and the system device power controller 175. The activation circuit 115 is coupled to the low current circuit 125 through the communication interface 120. Further, the programmable IC power controller 135 is coupled (e.g., connected) to the low current circuit 125, the memory module 140, and the programmable IC 160. The programmable IC 160 is coupled (e.g., connected) to the low current circuit 125, the system device power controller 175, and the system device 195. Additionally, the programmable IC 160 is coupled to the memory module 140 through the memory bus 165. The system device power controller 175 is coupled (e.g., connected) to the system device 195. The communication link 190 is coupled (e.g., connected) to the programmable IC 160 and the system device 195. In various embodiments, the programmable IC 160 is programmable logic device (PLD) such as a field programmable gate array (FPGA).

In some embodiments, the power source 105 provides a system power signal 110 to the activation circuit 115, the low current circuit 125, the programmable IC power controller 135, and the system device power controller 175. In this way, the power source 105 provides electrical power to the activation circuit 115, the low current circuit 125, the programmable IC power controller 135, and the system device power controller 175. The electronic system 100 reduces power consumption in the electronic system 100 by selectively powering up (e.g., powering on) the programmable IC 160 and selectively powering down (e.g., powering off) the programmable IC 160. Moreover, the electronic system 100 partially configures the programmable IC 160 upon power up before configuring the remainder of the programmable IC 160, which reduces the response time of the programmable IC 160 (i.e., the ability of the programmable IC 160 to responds to an input signal or generate an output signal). In further embodiments, the electronic system 100 further reduces power consumption in the electronic system 100 by selectively powering up and powering down the system device 195.

The electronic system 100 may be any electrical system or device including the programmable IC 160. Moreover, the activation circuit 115 may be any system or device for generating a signal (e.g., a communication) indicating a stimulus occurring an environment of the programmable IC 160. For example, the activation circuit 115 may be a microprocessor, an embedded processor, a microcontroller, a sequential logic circuit, a combinatorial logic circuit, or the like, or include some combination thereof. The memory module 140 may be any system or device for storing configuration data for the programmable IC 160. For example, the memory module 140 may be a nonvolatile memory, such as a read-only memory (ROM), an erasable programmable read-only memory (EPROM), an electrically erasable read-only memory (EEPROM), a flash storage device, or the like. In various embodiments, the activation circuit 115 transmits a communication on the communication interface 120 for controlling operation of the electronic system 100. The low current circuit 125 detects a stimulus in the communication interface 120 resulting from the communication, generates a power activation signal 130 in response to detection of the stimulus, and provides the power activation signal 130 to the programmable IC power controller 135. In various embodiments, the communication interface 120 is a controller area network (CAN) bus and the power activation signal 130 indicates a transaction or transfer occurring on the CAN bus.

In some embodiments, the communication interface 120 is optional. In these embodiments, the activation circuit 115 transmits a signal indicating a stimulus in the environment of the programmable IC 160 (e.g., a communication) to the low current circuit 125 without using a communication interface. For example, the activation circuit 115 may transmit a signal indicating a stimulus occurring in the environment of the programmable IC 160 to the low current circuit 125 through an electrical wire, an optical fiber, or a wireless communication link. In various embodiments, the activation circuit 115, the low current circuit 125, the programmable IC power controller 135, the system device power controller 175, the communication link 190, or the system device 195, or some combination thereof, are optional. In some embodiments, the power source 105, the activation circuit 115, the low current circuit 125, the programmable IC power controller 135, the system device power controller 175, the communication link 190, or the system device 195, or some combination thereof, are external to the electronic system 100. In one embodiment, the electronic system 100 includes the activation circuit 115, the communication interface 120, the memory module 140, the programmable IC 160, and the memory bus 165. In this embodiment, the programmable IC 160 is powered up when the electronic system 100 is powered up. Moreover, the programmable IC 160 performs an initial partial configuration of the programmable IC 160 upon power up to enable an initial functionality of the programmable IC 160. Further, the programmable IC 160 receives a signal (e.g., a communication) from the activation circuit 115 through the communication interface 120 and determines based on the signal whether to perform a subsequent partial configuration of the programmable IC 160 to enable an additional functionality of the programmable IC 160.

In various embodiments, the programmable IC power controller 135 receives the power activation signal 130 from the low current circuit 125. In turn, the programmable IC power controller 135 generates a programmable IC activation signal 155 in response to receiving the power activation signal 130 and provides the programmable IC activation signal 155 to the memory module 140 and the programmable IC 160. In some embodiments, the programmable IC activation signal 155 includes a voltage and a current for powering up the programmable IC 160 and maintaining the voltage and current when the programmable IC activation signal 155 is enabled. In this way, the programmable IC power controller 135 provides electrical power to the programmable IC 160 by enabling the programmable IC activation signal 155 and the programmable IC activation signal 155 functions as a bootstrap signal for the programmable IC 160. Moreover, the power-down signal 150 when enabled functions as a keep-alive signal for the programmable IC 160.

In some embodiments, the power source 105 regulates the voltage of the system power signal 110 and the programmable IC power controller 135 passes the system power signal 110 to the memory module 140 and the programmable IC 160 as the programmable IC activation signal 155 if the power down signal 150 is inactive. For example, the power down signal 150 may have a voltage of zero when the power down signal 150 is inactive and have a voltage above a predetermined threshold value when the power down signal is active. In some embodiments, the programmable IC power controller 135 regulates the voltage of the programmable IC activation signal 155. In this way, the programmable IC power controller 135 regulates the voltage of the electrical power provided by the programmable IC power controller 135 to the programmable IC 160.

In various embodiments, the programmable IC 160 receives the programmable IC activation signal 155 and powers up in response to receiving the programmable IC activation signal 155. For example, the programmable IC 160 may include a power on reset circuit for resetting a logic state of circuitry in the programmable IC 160 in response to receiving the programmable IC activation signal 155. Additionally, the programmable IC 160 performs an initial partial configuration in response to receiving the programmable IC activation signal 155 for providing an initial functionality of the programmable IC 160. The initial functionality of the programmable IC 160 is operational upon completion of the initial partial configuration. Moreover, the initial functionality of the programmable IC 160 includes communicating with one or more devices external to the programmable IC 160.

The memory module 140 stores configuration data for programming functionality of the programmable IC 160. Upon power up of the programmable IC 160 (e.g., power on reset), the programmable IC 160 reads initial configuration data from the memory module 140 and performs an initial partial configuration of the programmable IC 160 by programming an initial functionality of the programmable IC 160 based on the initial configuration data. In various embodiments, the low current circuit 125 provides an input signal 145 to the programmable IC 160 based on a stimulus (e.g., communication) detected on the communication interface 120, and the programmable IC 160 performs an operation in response to receiving the input signal 145 and based on the initial functionality of the programmable IC 160.

In one embodiment, the activation circuit 115 transmits a subsequent signal (e.g., a second communication) on the communication interface 120, for example if the activation circuit 115 does not receive an acknowledgement from the communication interface 120 in response to the previous signal (e.g., a first communication). In this embodiment, the low current circuit 125 detects the subsequent signal and generates the input signal 145 in response to detecting the subsequent signal on the communication interface 120. For example, the activation circuit 115 may transmit the subsequent signal (e.g., the second communication) on the communication interface 120 by retransmitting the previous signal (e.g., the first communication) on the communication interface 120 if the activation circuit 115 does not receive an acknowledgement in response to the previous signal (e.g., the first communication) within a predetermined time period after transmitting the previous signal on the communication interface 120.

The programmable IC 160 determines based on an input signal (e.g., the input signal 142 or 145) whether to program additional functionality of the programmable IC 160. If the programmable IC 160 determines to program additional functionality of the programmable IC 160, the programmable IC 160 reads subsequent configuration data from the memory module 140 through a memory bus 165, and programs the additional functionality of the programmable IC 160 based on the subsequent configuration data. Because the initial functionality of the programmable IC 160 is enabled before programming the additional functionality of the programmable IC 160, the time duration between power up of the programmable IC 160 and the ability of the programmable IC 160 to respond to an input signal or generate an output signal (i.e., the response time of the programmable IC 160) is reduced.

Otherwise, if the programmable IC 160 determines not to program the additional functionality of the programmable IC 160, the programmable IC 160 generates a power down signal 150 for powering down the programmable IC 160, and outputs the power down signal 150 from the programmable IC 160. In turn, the programmable IC power controller 135 disables the programmable IC activation signal 155 in response to receiving the power down signal 150. In this way, the programmable IC power controller 135 powers down the programmable IC 160 by cutting off electrical power to the programmable IC 160. In other embodiments, the programmable IC 160 determines based on the input signal 145 whether to program additional functionality of the programmable IC 160 or to generate the power down signal 150.

Because the programmable IC power controller 135 powers down the programmable IC 160 in response to receiving the power down signal 150, power consumption is reduced in the programmable IC 160. Power consumption is further reduced in the programmable IC 160 because the programmable IC 160 need not program the additional functionality of the programmable IC 160. In this way, power consumption is reduced in the electronic system 100 by selectively programming the additional functionality of the programmable IC 160.

Power consumption is also reduced in the electronic system 100 because the low current circuit 125 draws a low current from the power source 105 (i.e., less than a current drawn from the power source 105 by the programmable IC power controller 135 when the programmable IC power controller 135 is powered up). Power consumption is further reduced in the electronic system 100 because the programmable IC power controller 135 draws less current from the power source 105 when the programmable IC activation signal 155 is disabled (e.g., the programmable IC 160 is powered down) than when programmable IC activation signal 155 is enabled (i.e., the programmable IC 160 is powered up).

In further embodiments, the programmable IC 160 generates a system device power up signal 170 before the programmable IC 160 completes programming the additional functionality of the programmable IC 160. Moreover, the programmable IC 160 outputs the system device power up signal 170 from the programmable IC 160 before programming of the additional functionality of the programmable IC 160 is completed. In turn, the system device power controller 175 generates a system device power signal 185 for powering up the system device 195 in response to receiving the system device power up signal 170 and provides the system device power signal 185 to the system device 195. The system device power signal 185 includes a voltage and a current for powering up the system device 195 when the system device power signal 185 is enabled. In this way, the system device power controller 175 provides electrical power to the system device 195 by enabling the system device power signal 185. In some embodiments, the system device power controller 175 regulates the voltage of the system device power signal 185. In this way, the system device power controller 175 regulates the voltage of the electrical power provided by the system device power controller 175 to the system device 195.

The system device 195 receives the system device power signal 185 and powers up in response to receiving the system device power signal 185. For example, the system device 195 may include a power on reset circuit for resetting a logic state of circuitry in the system device 195 in response to receiving the system device power signal 185. In some embodiments, the system device 195 is a programmable logic device, such a field programmable gate array.

In further embodiments, the programmable IC 160 generates a system device control signal 180 after programming the initial functionality of the programmable IC 160. Moreover, the programmable IC 160 outputs the system device control signal 180 from the programmable IC 160 before the programmable IC 160 completes programming the additional functionality of the programmable IC 160. The system device 195 receives the system device control signal 180 and initiates an operation in response to receiving the system device control signal 180. For example, the system device 195 may begin to perform an initialization operation in response to receiving the system device control signal 180.

In these further embodiments, the programmable IC 160 communicates with the system device 195 though the communication link 190 after the additional functionality of the programmable IC 160 is enabled. For example, the programmable IC 160 may generate a subsequent system device control signal 180 and transmit the subsequent system device control signal 180 to the system device 195 on the communication link 190. In turn, the system device 195 performs a subsequent operation based on the subsequent system device control signal 180.

In one embodiment, the electronic system 100 functions to control an automotive electrical system. In this embodiment, the power source 105 is an automotive battery. Moreover, the low current circuit 125 draws less than one-hundred microamperes (100 uA) from the automotive battery when the low current circuit 125 is active and other components of the electronic system 100 are powered down. In another embodiment, the response time of the programmable IC 160 upon power up is less than one-hundred milliseconds (100 ms). In some embodiments, the response time of the electronic system 100 is less than one-hundred milliseconds (100 ms).

Figure 2:
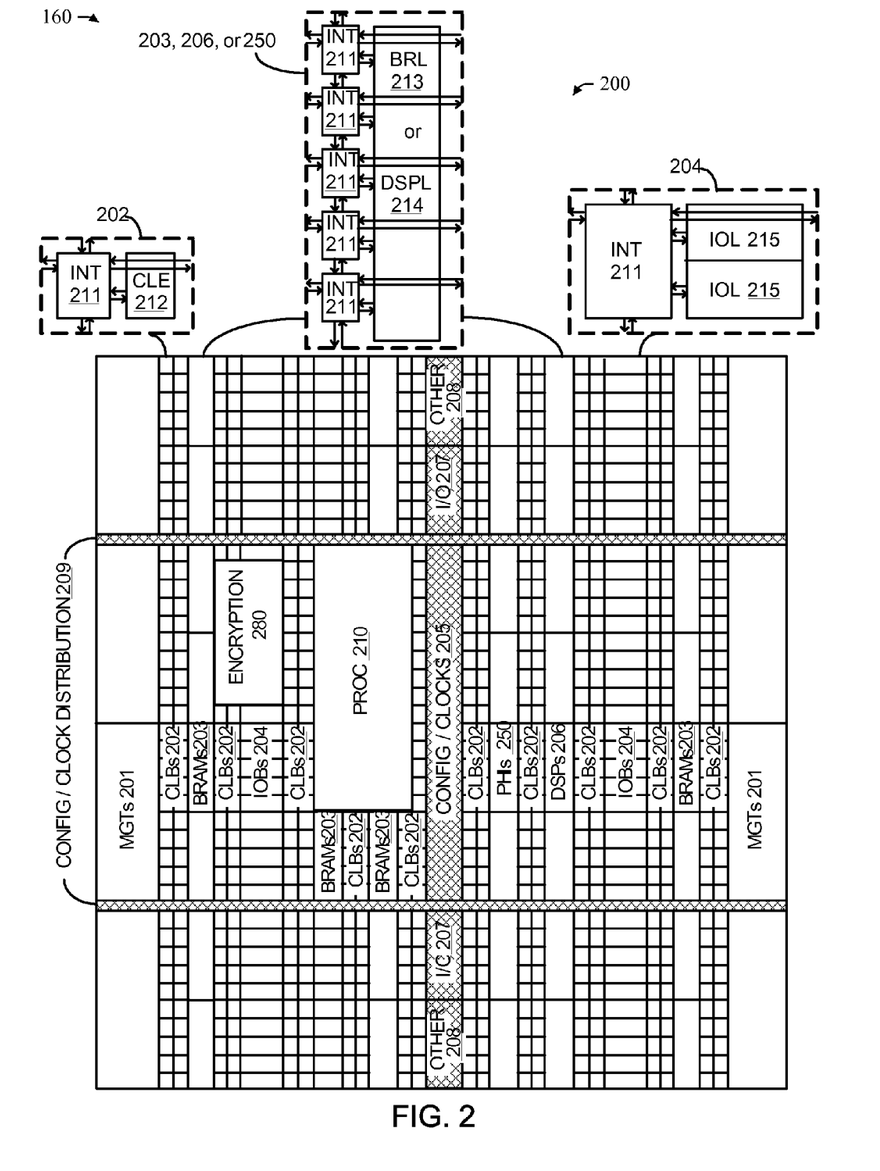
FIG. 2 is a block diagram of a first programmable integrated circuit, in accordance with an embodiment of the present invention.

FIG. 2 is a block diagram of an exemplary programmable IC 160, in accordance with an embodiment of the present invention. In the embodiment of FIG. 2, the programmable IC 160 is a field programmable gate array (FPGA) having a FPGA architecture 200 that includes a large number of different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks (DSPs) 206, specialized input/output blocks (I/O) 207 (e.g., configuration ports and clock ports), interface tiles (PHIs) 250 and other programmable logic 208 such as digital clock managers, analog-to-digital converters, system monitoring logic, and so forth. In addition, the FPGA architecture 200 may include one or more dedicated processor blocks (PROC) 210 and/or an encryption logic block (ENCRYPTION) 280. In other embodiments, the programmable IC 160 includes programmable tiles but does not include an FPGA architecture 200.

In some embodiments, each programmable tile of the FPGA architecture 200 includes a programmable interconnect element (INT) 211 having standardized connections to and from a corresponding programmable interconnect element (INT) 211 in each adjacent tile. Therefore, the programmable interconnect elements (INT) 211 taken together implement a programmable interconnect structure for the FPGA architecture 200. The programmable interconnect element (INT) 211 also includes the connections to and from the programmable logic 208 within the same tile, as shown by the examples included at the top of FIG. 2.

For example, a CLB 202 can include a configurable logic element (CLE) 212 that can be programmed to implement user logic and a single programmable interconnect element (INT) 211. A BRAM 203 can include a BRAM logic element (BRL) 213 in addition to one or more programmable interconnect elements (INT) 211. Typically, the number of programmable interconnect elements (INT) 211 included in a tile depends on the height of the tile. In the pictured embodiment, a BRAM 203 has the same height as five CLBs 202, but other numbers of interconnected elements (e.g., six) can also be used. A DSP block 206 can include a DSP logic element (DSPL) 214 in addition to an appropriate number of programmable interconnect elements (INT) 211. An IOB 204 can include, for example, two instances of an input/output logic element (IOL) 215 in addition to one instance of the programmable interconnect element (INT) 211. As will be clear to those of skill in the art, the actual I/O pads connected, for example, to the input/output logic element (IOL) 215 are manufactured using metal layered on the various illustrated logic blocks, and typically are not confined to the area of the input/output logic element (IOL) 215.

Configuration/clock distribution logic 205 includes configuration, clock, and other control logic. Horizontal areas 209 extending from this column are used to distribute the clocks and configuration signals across the breadth of the FPGA. In some embodiments, the FPGA architecture 200 illustrated in FIG. 2 includes additional logic blocks that disrupt the regular columnar structure making up a large part of the FPGA architecture 200. The additional logic blocks can be programmable blocks and/or dedicated logic. For example, the processor block (PROC) 210 shown in FIG. 2 spans several columns of CLBs 202 and BRAMs 203.

FIG. 2 is intended to illustrate an exemplary FPGA architecture 200. The numbers of logic blocks in a column, the relative width of the columns, the number and order of columns, the types of logic blocks included in the columns, the relative sizes of the logic blocks, the incorporation of hard blocks such as processor block (PROC) 210, and the interconnect/logic implementations included at the top of FIG. 2 will vary in accordance with the requirements of each application. In various embodiments, the FPGA architecture 200 has more than one adjacent column of CLBs 202 to facilitate the efficient implementation of user logic, but the number of adjacent columns of CLBs 202 varies with the overall size of the FPGA architecture 200.

Figure 3:
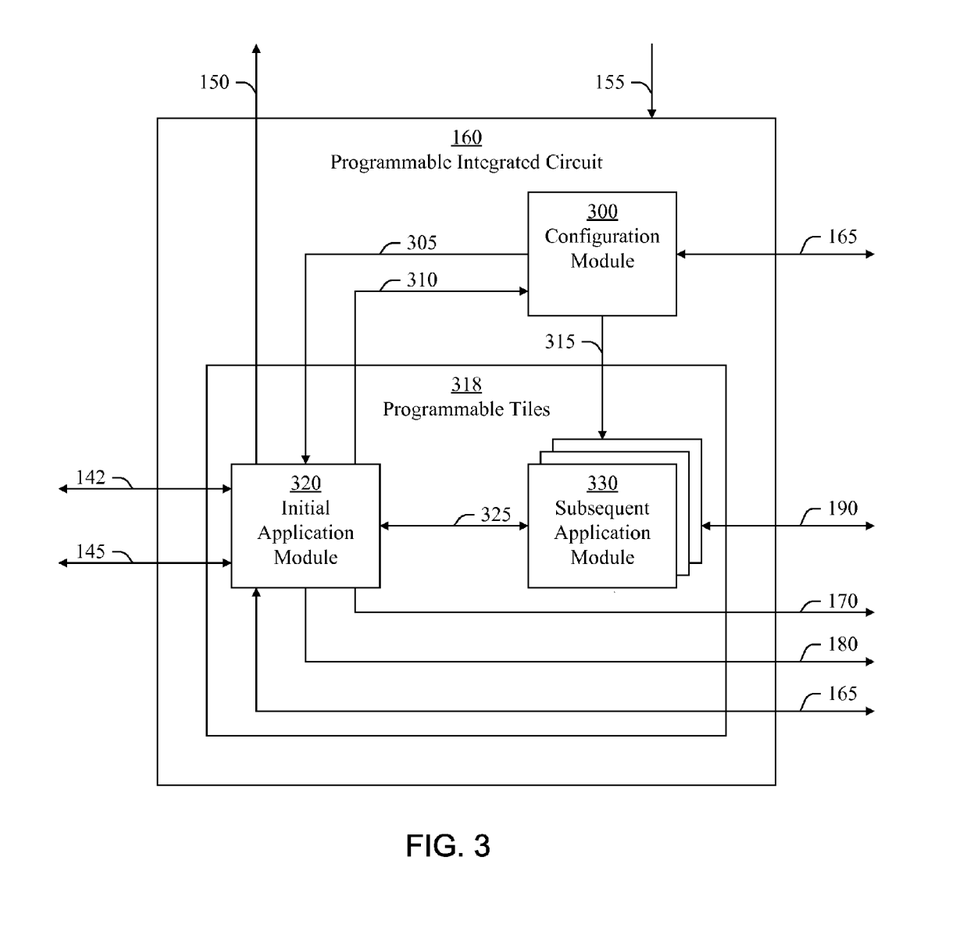
FIG. 3 is a block diagram of a second programmable integrated circuit, in accordance with an embodiment of the present invention.

FIG. 3 is a block diagram of another exemplary programmable IC 160, in accordance with an embodiment of the present invention. The programmable IC 160 includes a configuration module 300 and programmable tiles 318 coupled to the configuration module 300. The programmable tiles 318 include an initial application module 320 and one or more subsequent application modules 330. The initial application module 320 includes one or more of the programmable tiles 318 and each of the subsequent application modules 330 includes one or more of the programmable tiles 318. The configuration module 300 is coupled (e.g., connected) to the initial application module 320 and each subsequent application module 330. Additionally, the initial application module 320 may be coupled (e.g., connected) to one or more of the subsequent application modules 330 through an optional communication link 325. For example, the communication link 325 may be a programmable interconnect element (e.g., programmable interconnect element 211).

The programmable IC 160 includes a configuration memory distributed among the programmable tiles 318 for programming functionality of the programmable IC 160. For example, the configuration memory may be located in columns within the programmable tiles 318. Moreover, each of the programmable tiles 318 includes configurable logic and a portion of the configuration memory for configuring the configurable logic in that programmable tile 318.

The initial application module 320 is configured to program an initial functionality of the programmable IC 160 by writing configuration data into the portion of the configuration memory in the initial application module 320. Each of the subsequent application modules 330 is configured to program an additional functionality of the programmable IC 160 by writing configuration data into the portion of the configuration memory in that subsequent application module 330.

In various embodiments, the programmable IC 160 is a programmable logic device such as an FPGA, and the programmable tiles 318 may include one or more multi-gigabit transceivers (e.g., MGT 201), configurable logic blocks (e.g., CLB 202), random access memory blocks (e.g., BRAM 203), input/output blocks (e.g., IOB 204), configuration and clocking logic (e.g., CONFIG/CLOCKS 205), digital signal processing blocks (e.g., DSP 206), specialized input/output blocks (e.g., I/O 207), interface tiles (e.g., PHI 250), or the like. In some embodiments, the programmable tiles 318 of the initial application module 320 are configurable logic blocks. In some embodiments, the programmable tiles 318 of both the initial application module 320 and one or more of the subsequent application modules 330 are configurable logic blocks.

In various embodiments, the configuration module 300 reads initial configuration data 305 from the memory module 140 through the memory bus 165 and writes the initial configuration data 305 to the configuration memory of the programmable IC 160 to configure the initial application module 320 in response to activation of the programmable IC activation signal 155 (e.g., upon power up of the programmable IC 160). In this way, the configuration module 300 performs an initial partial configuration of the programmable IC 160 and programs an initial functionality of the programmable IC 160 in response to the programmable IC activation signal 155. Moreover, the initial partial configuration of the programmable IC 160 forms the initial application module 320 in the programmable tiles 318. As a result, the initial application module 320 has the initial functionality of the programmable IC 160.

In various embodiments, the configuration module 300 may be any device or system for configuring the initial application module 320 or the subsequent application module 330, or both. For example, the configuration module 300 may be a configuration block 205. In various embodiments, the configuration module 300 includes a serial peripheral interface (SPI) or a byte peripheral interface (BPI), as is well known in the art. In some embodiments, the configuration module 300 includes an internal configuration access port (ICAP).

After programming, the initial application module 320 receives an input signal (e.g., the input signal 142 or the input signal 145) and determines whether the input signal indicates a stimulus (e.g., a predetermined stimulus) occurring in the environment of the programmable IC 160. For example, the stimulus may be an event occurring in the electronic system 100. If the initial application module 320 determines that the input signal does not indicate a stimulus occurring in the environment of the programmable IC 160, the initial application module 320 generates the power down signal 150 indicating the programmable IC 160 is to be powered down. For example, the power down signal 150 may have a voltage above a threshold voltage (e.g., a predetermined threshold voltage) indicating the programmable IC 160 is to be powered down. In turn, the programmable IC power controller 135 powers down the programmable IC 160 by disabling the programmable IC activation signal 155. In this way, the programmable IC power controller 135 cuts off electrical power to the programmable IC 160.

Otherwise, if the initial application module 320 determines that the input signal (e.g., the input signal 142 or the input signal 145) indicates a stimulus occurring in the environment of the programmable IC 160, the initial application module 320 generates a configuration sequencing signal 310 identifying a subsequent application module 330. In turn, the configuration module 300 reads subsequent configuration data 315 from the memory module 140 through the memory bus 165 and writes the subsequent configuration data 315 to the configuration memory of the programmable IC 160 to configure the subsequent application module 330 in response to the configuration sequencing signal 310. In this way, the configuration module 300 performs a subsequent partial configuration of the programmable IC 160 and programs an additional functionality of the programmable IC 160 in response to the configuration sequencing signal 310. Moreover, the subsequent partial configuration of the programmable IC 160 forms the subsequent application module 320 in the programmable tiles 318. As a result, the subsequent application module 330 has the additional functionality of the programmable IC 160. In some embodiments, the additional functionality of the subsequent application module 330 allows the programmable IC 160 to communicate with the system device 195 through the communication link 190.

In some embodiments, the configuration sequencing signal 310 identifies a sequence of the subsequent application modules 330, and the configuration module 300 configures the subsequent application modules 330 in sequence according to the configuration sequencing signal 310. In this way, the configuration module 300 performs a sequence of subsequent partial configurations of the programmable IC 160 and programs a sequence of additional functionalities of the programmable IC 160. Moreover, each of the subsequent application modules 330 in the sequence is operational upon the subsequent partial configuration of the subsequent application module 330. In this way, the response time of the programmable IC 160 is reduced for each of the additional functionalities provided by the subsequent application modules 330 in the sequence of subsequent application modules 330.

In some embodiments, the initial application module 320 generates the system device power up signal 170. Moreover, the initial application module 320 generates the system device power up signal 170 before the configuration module 300 completes programming of a subsequent application module 330. In this way, the initial application module 320 enables the initial functionality of the programmable IC 160. In further embodiments, the initial application module 320 generates the system device control signal 180. In embodiments in which a subsequent application module 330 communicates with the system device 195 through the communication link 190, the initial application module 320 generates the system device control signal 180 before any of the subsequent application modules 330 communicates with the system device 195 through the communication link 190.

In some embodiments, the programmable IC 160 receives the input signal 142 from the communication interface 120 and receives the input signal 145 from the low current circuit 125. In other embodiments, the programmable IC 160 receives either the input signal 142 from the communication interface 120 or the input signal 145 from the low current circuit 125. For example, the programmable IC 160 may receive the input signal 142 in embodiments including the communication interface 120 but not the low current circuit 125. As another example, the programmable IC 160 may receive the input signal 145 in embodiments including the low current circuit 125 but not the communication interface 120.

In some embodiments, the initial application module 320 is coupled (e.g., connected) to the memory bus 165. In these embodiments, the initial application module 320 reads subsequent configuration data 315 from the memory module 140 through the memory bus 165 and writes the subsequent configuration data 315 to the configuration memory of the programmable IC 160 to configure one or more of the subsequent application modules 330. In this way, the initial application module 320 performs one or more subsequent partial configurations of the programmable IC 160 and programs an additional functionality of the programmable IC 160 corresponding to each subsequent application module 330 configured by the initial application module 320. As a result, each of the subsequent application modules 330 configured by the initial application module 320 has the additional functionality of the programmable IC 160 corresponding to that subsequent application module 330. Moreover, each subsequent application module 330 is operational upon the subsequent partial configuration of that subsequent application module 330.

Figure 4:
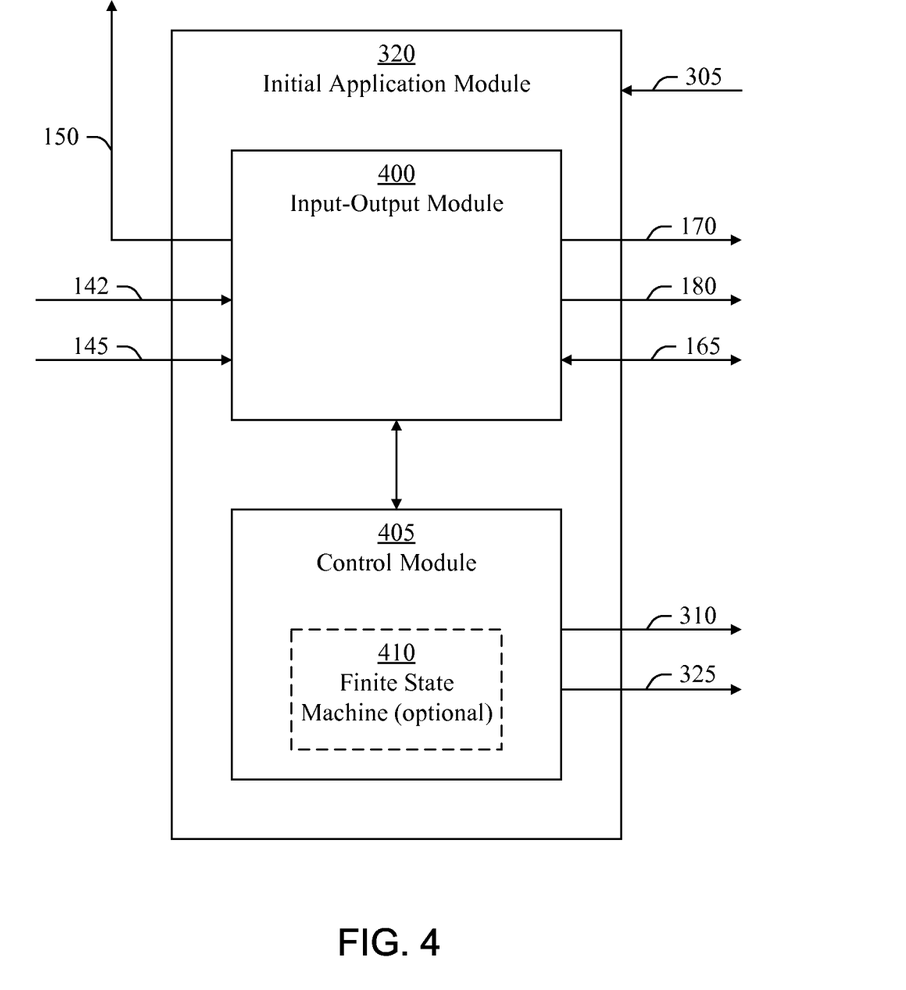
FIG. 4 is a block diagram of an initial application module, in accordance with an embodiment of the present invention.

FIG. 4 is a block diagram of the initial application module 320, in accordance with an embodiment of the present invention. The initial application module 320 includes an input-output module 400 and a control module 405 coupled (e.g., connected) to the input-output module 400. Each of the input-output module 400 and the control module 405 includes one or more of the programmable tiles 318. The configuration module 300 configures the input-output module 400 and the control module 405 by configuring the initial application module 320, as is described more fully herein.

In operation, the input-output module 400 receives one or more input signals (e.g., the input signal 142 or 145) and outputs one or more output signals (e.g., the power down signal 150). For example, the input-output module 400 may include programmable tiles 318 configured to receive input signals and programmable tiles 318 configured to drive output signals. The control module 405 generates the power down signal 150 and the configuration sequencing signal 310 based on the input signal received by the input-output module 400. In this way, the control module 405 controls generation of the power down signal 150 and the configuration sequencing signal 310. In various embodiments, the control module 405 may include a finite state machine, a programmable embedded processor, a fixed embedded processor (e.g., a hard wired or hard coded embedded processor), or the like, for controlling operation of the initial application module 320.

In various embodiments, the control module 405 of the initial application module 320 includes an optional finite state machine 410 for controlling operation of the initial application module 320. For example, the control module 405 may include one or more programmable tiles 318 implementing the finite state machine 410. In some embodiments, the finite state machine 410 determines based on an input signal (e.g., the input signal 142 or the input signal 145) whether the initial application module 320 reads subsequent configuration data 315 from the memory module 140 and writes the subsequent configuration data 315 to the configuration memory of the programmable IC 160 to configure a subsequent application module 330. In this way, the finite state machine 410 determines based on the input signal whether the initial application module 320 performs a subsequent partial configuration of the subsequent application module 330.

In further embodiments, the finite state machine 410 in the initial application module 320 performs a sequence of subsequent partial configurations of the subsequent application modules 330. Moreover, each of the subsequent application modules 330 is operational upon the subsequent partial configuration of the subsequent application module 330. In this way, the response time of the programmable IC 160 is reduced for each of the additional functionalities provided by each of the subsequent application modules 330 in the sequence of subsequent application modules 330.

In one embodiment, the input-output module 400 is configured to implement a peripheral component interconnect express (PCI-express) standard developed by the Intel Corporation of Santa Clara, Calif. In this embodiment, the input-output module 400 provides functionality of the PCI-express standard to the programmable IC 160. In further embodiments, the programmable IC 160 may communicate with the system device 190 through the communication link 190 by using a PCI-express protocol after the input-output module 400 is configured to have the functionality of the PCI-express standard. In some embodiments, the configuration module 300 configures the input-output module 400 to implement the functionality of the PCI-express standard within one hundred milliseconds (100 ms) of when the programmable IC activation signal 155 is enabled.

Figure 5:
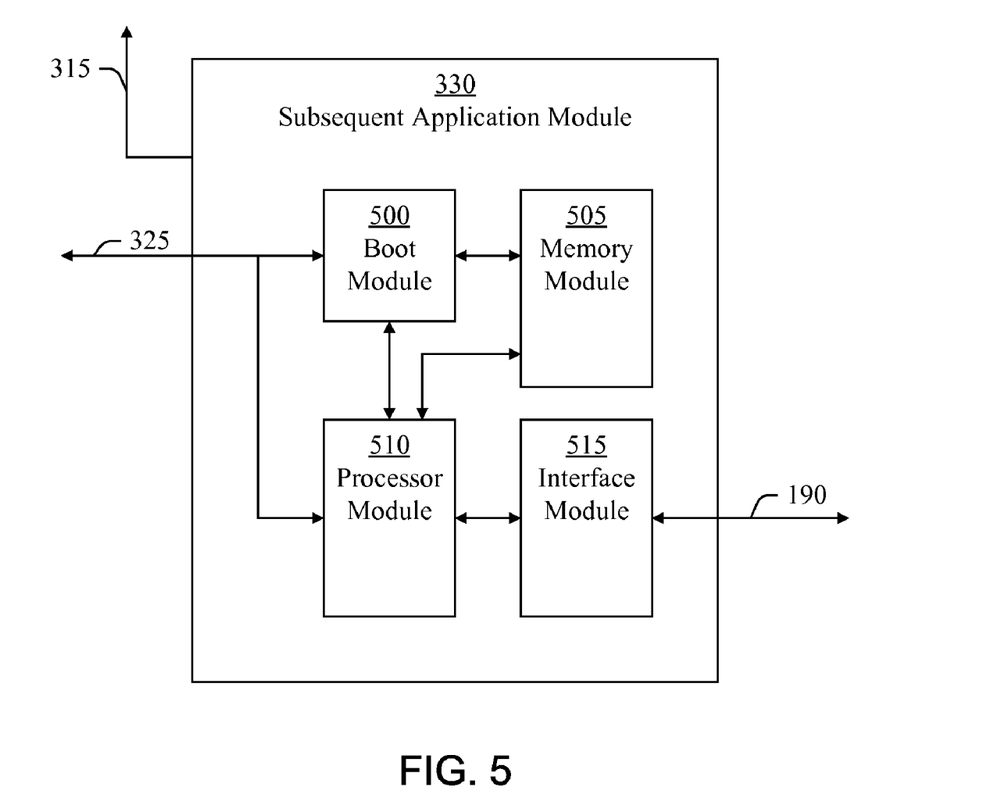
FIG. 5 is a block diagram of a subsequent application module, in accordance with an embodiment of the present invention.

FIG. 5 is a block diagram of the subsequent application module 330, in accordance with an embodiment of the present invention. The subsequent application module 330 includes a boot module 500, a memory module 505, a processor module 510, and an interface module 515. The boot module 500 is coupled (e.g., connected) to the memory module 505 and the processor module 510. Additionally, the processor module 510 is coupled (e.g., connected) to the memory module 505 and the interface module 515, and the interface module 515 is coupled (e.g., connected) to the communication link 190. In various embodiments, the configuration module 300 configures the boot module 500, the memory module 505, the processor module 510, and the interface module 515 by configuring the subsequent application module 330, as is described more fully herein.

In operation, the boot module 500 loads an operating system into the memory module 505 and initializes the processor module 510. In this way, the boot module 500 boots the processor module 510. In turn, the processor module 510 accesses the operating system in the memory module 505 and executes the operating system. The interface module 515 facilitates communications between the processor module 510 and the communication link 190. Because the configuration module 300 configures the subsequent application module 330 based on the configuration sequencing signal 310 generated by the initial application module 320, the boot module 500 does not load the operating system into the memory module 505 or initialize the processor module 510. In this way, the subsequent application module 330 reduces power consumption in the programmable IC 160.

Figure 6:
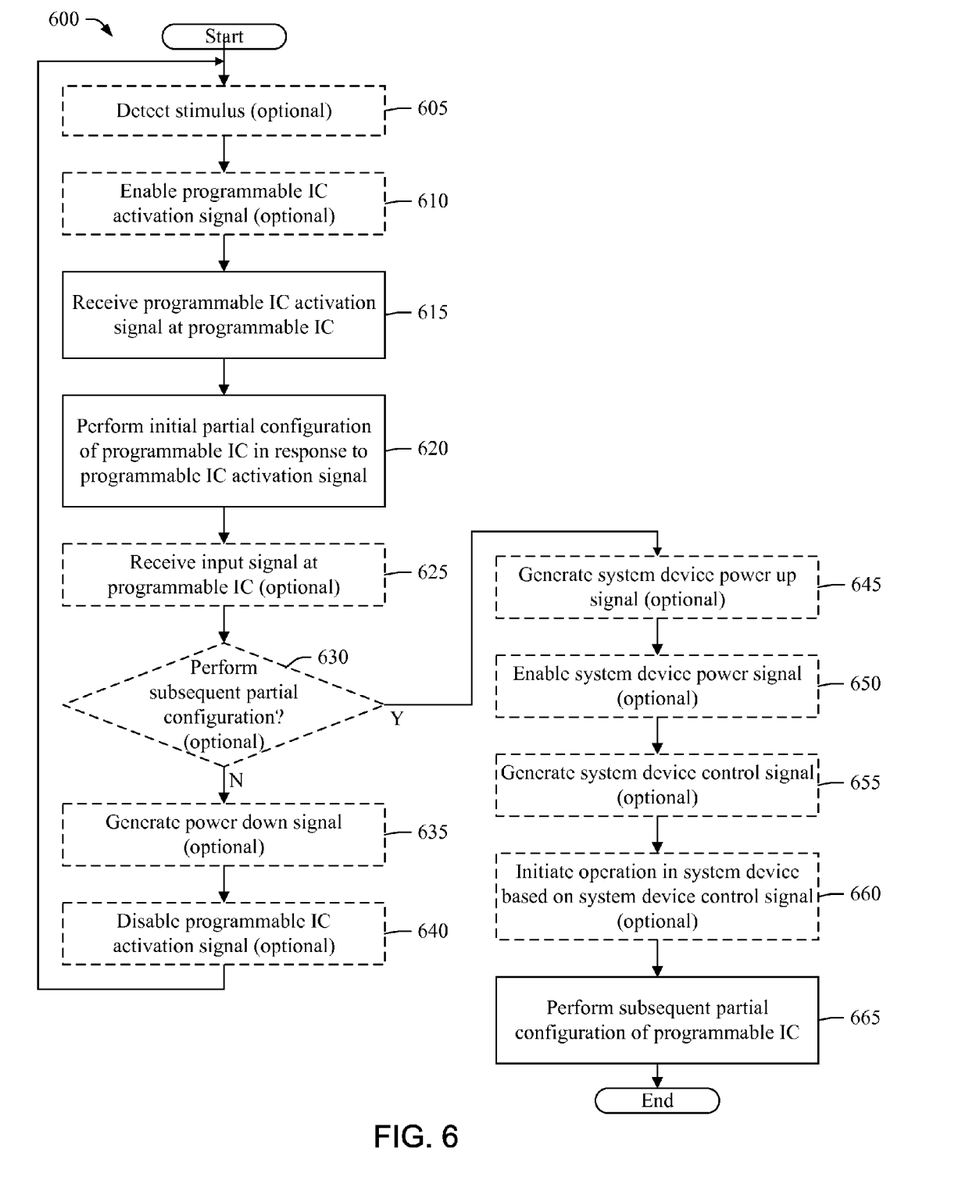
FIG. 6 is a flow chart of a method of configuring a programmable integrated circuit, in accordance with an embodiment of the present invention.

FIG. 6 is a flow chart of a method 600 of configuring a programmable IC (e.g., a programmable logic device), in accordance with an embodiment of the present invention. In optional step 605, a stimulus is detected. In various embodiments, the low current circuit 125 detects a stimulus (e.g., a communication) in the communication interface 120. For example, the activation circuit 115 may transmit a communication on the communication interface 120, and the low current circuit 125 may detect the communication transmitted on the communication interface 120 by detecting electrical activity on the communication interface 120. Additionally, the low current circuit 125 generates the power activation signal 130 in response to detecting the stimulus on the communication interface 120. The method 600 then proceeds to step 610.

In optional step 610, a programmable IC activation signal is enabled. In various embodiments, the programmable IC power controller 135 enables the programmable IC activation signal 155 in response to the power activation signal 130. The method 600 then proceeds to step 615.

In step 615, the programmable IC activation signal is received at a programmable IC. In various embodiments, the programmable IC 160 receives the programmable IC activation signal 155. In some embodiments, the programmable IC 160 powers up in response to receiving the programmable IC activation signal 155. In some embodiments, the programmable IC 160 includes a power on reset circuit for initializing the programmable IC 160 in response to receiving the programmable IC activation signal 155. The method 600 then proceeds to step 620.

In step 620, an initial partial configuration of the programmable IC is performed in response to the programmable IC activation signal. In various embodiments, the programmable IC 160 performs an initial partial configuration of the programmable IC 160 by configuring the initial application module 320 of the programmable IC 160 in response to receiving the programmable IC activation signal 155. In this way, the programmable IC activation signal 155 triggers the initial partial configuration of the programmable IC 160. In some embodiments, the programmable IC activation signal is a power signal for powering up the programmable IC 160, and the programmable IC 160 configures the initial application module 320 upon power up. In this way, the programmable IC activation signal 155 is a bootstrap signal for the programmable IC 160. The method 600 then proceeds to step 625.

In optional step 625, an input signal is received at the programmable IC. In various embodiments, the programmable IC 160 receives the input signal 145 at the programmable IC 160. In some embodiments, the low current circuit 125 detects a stimulus based on a communication in the communication interface 120 and generates the input signal 145 in response to detecting the stimulus. In some embodiments, the activation circuit 115 transmits the communication through the communication interface 120 by retransmitting the communication previously transmitted on the communication interface 120. The method 600 then proceeds to step 630.

In optional step 630, a determination is made as to whether to perform a subsequent partial configuration of the programmable IC. In various embodiments, the initial application module 320 of the programmable IC 160 determines based on an input signal (e.g., the input signal 142 or the input signal 145) received by the programmable IC 160 whether a subsequent partial configuration is to be performed on the programmable IC 160. If the initial application module 320 determines a subsequent partial configuration is to be performed on the programmable IC 160, the method 600 proceeds to step 645. Otherwise, the method 600 proceeds to step 635.

In optional step 635, arrived at from the determination in step 630 that a subsequent partial configuration is not to be performed on the programmable IC 160, a power down signal in generated. In various embodiments, the initial application module 320 of the programmable IC 160 generates the power down signal 150, and the programmable IC 160 outputs the power down signal 150. The method 600 then proceeds to step 640.

In optional step 640, the programmable IC activation signal is disabled. In various embodiments, the programmable IC power controller 135 disables the programmable IC activation signal 155 in response to receiving the power down signal 150. In this way, the programmable IC power controller 135 powers down the programmable IC 160. The method 600 then returns to step 605.

In optional step 645, arrived at from step 620 in embodiments without steps 625, 630, 635, and 640, or from the determination in step 630 that a subsequent partial configuration is to be performed on the programmable IC, a system device power up signal is generated. In various embodiments, the initial application module 320 of the programmable IC 160 generates the system device power up signal 170, and the programmable IC 160 outputs the system device power up signal 170. The method 600 then proceeds to step 650.

In optional step 650, a system device power signal is enabled. In various embodiments, the system device power controller 175 enables the system device power signal 185 in response to receiving the system device power up signal 170. The method 600 then proceeds to step 655.

In optional step 655, a system device control signal is generated. In various embodiments, the initial application module 320 of the programmable IC 160 generates the system device control signal 180, and the programmable IC 160 outputs the system device control signal 180. The method 600 then proceeds to step 660.

In optional step 660, an operation is initiated in the system device based on the system device control signal. In various embodiments, the system device 195 initiates an operation based on the system device control signal 180. In some embodiments, the system device 195 initiates an operation based on the system device control signal 180 by beginning to perform an initialization operation in the system device 195 in response to receiving the system device control signal 180. The method 600 then proceeds to step 665.

In step 665, a subsequent partial configuration of the programmable IC is performed. In various embodiments, the programmable IC 160 performs a subsequent partial configuration of the programmable IC 160 by configuring a subsequent application module 330 of the programmable IC 160 based on an input signal received by the programmable IC 160 (e.g., the input signal 142 or the input signal 145). In some embodiments, the initial application module 320 of the programmable IC 160 sequentially configures a number of subsequent application modules 300 of the programmable IC 160, based on the input signal received by the programmable IC 160. In other embodiments, the programmable IC 160 sequentially configures a number of subsequent application modules 330 of the programmable IC 160 based on the configuration sequencing signal 310. In various embodiments, the programmable IC 160 is fully configured when the programmable IC 160 configures the initial application module 320 and all of the subsequent application modules 330 in the programmable IC 160. Moreover, the programmable IC 160 is deemed to be in a low power mode of operation before full configuration of the programmable IC 160, and to be in a normal mode of operation upon full configuration of the programmable IC 160. The method 600 then ends.

As previously described, the initial partial configuration and the subsequent configurations can utilize configuration data from a single configuration bitstream or from different configuration bitstreams. In one embodiment, a first configuration bitstream includes header information followed by configuration data for the first partial configuration, including data implementing logic to download a second bitstream, followed by commands to start execution of the programmable IC. The second bitstream includes header information, followed by data for the subsequent configuration, optionally followed by further commands. In other embodiments, a single configuration bitstream includes, in order, header information, data to implement the first partial configuration, first commands to start execution of the programmable IC, data to implement the subsequent configuration, and (optionally) second commands.

In various embodiments, the method 600 may include more or fewer steps than the steps 605-665 described above and illustrated in FIG. 6. In some embodiments, the steps 605-665 of the method 600 may be performed in a different order than that described above and illustrated in FIG. 6. In some embodiments, one or more of the steps 605-665 of the method 600 may be performed in parallel with each other or substantially simultaneously with each other.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims, and not by the above detailed description.

What is claimed is:

1. A programmable integrated circuit, comprising:
a plurality of programmable tiles; and
a configuration module coupled to the plurality of programmable tiles, the configuration module being configured to perform an initial partial configuration of the plurality of programmable tiles in response to a programmable integrated circuit activation signal received at the programmable integrated circuit,
wherein the initial partial configuration forms an initial application module having an initial functionality of the programmable integrated circuit for responding to an input signal received by the programmable integrated circuit, the initial application module being operational upon completion of the initial partial configuration, and
wherein the configuration module is further configured to perform a sequence of subsequent partial configurations of the plurality of programmable tiles after the initial partial configuration, each subsequent partial configuration of the sequence of subsequent partial configurations forming a subsequent application module having an additional functionality of the programmable integrated circuit and being operational upon completion of the subsequent partial configuration.

2. The programmable integrated circuit of claim 1, wherein the initial partial configuration and each subsequent partial configuration together constitute a complete configuration of the programmable integrated circuit.

3. The programmable integrated circuit of claim 1, wherein the initial partial configuration and the sequence of subsequent partial configurations are included in a same configuration bitstream for the programmable integrated circuit.

4. The programmable integrated circuit of claim 1, wherein the initial functionality includes determining based on the input signal whether to perform a subsequent partial configuration of the plurality of programmable tiles to form a subsequent application module having an additional functionality of the programmable integrated circuit or to generate an output signal for powering down the programmable integrated circuit without performing the subsequent partial configuration.

5. The programmable integrated circuit of claim 4, wherein the initial functionality comprises generating a power up signal for powering up an external device.

6. The programmable integrated circuit of claim 5, wherein the external device is a system device of an automotive electrical system.

7. The programmable integrated circuit of claim 1, wherein the initial application module is further configured to generate a configuration sequencing signal for performing the sequence of subsequent partial configurations.

8. An electronic system, comprising:
a programmable integrated circuit comprising:
plurality of programmable tiles, and
a configuration module coupled to the plurality of programmable tiles, the configuration module configured to perform an initial partial configuration of the plurality of programmable tiles in response to a programmable integrated circuit activation signal received at the programmable integrated circuit, the initial partial configuration forming an initial application module having an initial functionality of the programmable integrated circuit for responding to an input signal received by the programmable integrated circuit, the initial application module being operational upon completion of the initial partial configuration;
a low current circuit configured to detect a stimulus occurring in an environment of the programmable integrated circuit and generate a power activation signal based on the stimulus; and
a programmable integrated circuit power controller coupled to the low current circuit and configured to generate the programmable integrated circuit activation signal in response to receiving the power activation signal.

9. The electronic system of claim 8, further comprising a memory module coupled to the programmable integrated circuit power controller and the programmable integrated circuit, the memory module configured to receive the programmable integrated circuit activation signal and power up in response to receiving the programmable integrated circuit activation signal, the programmable integrated circuit further configured to perform the initial partial configuration by reading initial configuration data from the memory module and writing the initial configuration data to the programmable integrated circuit.

10. The electronic system of claim 9, wherein the programmable integrated circuit is further configured to perform a subsequent partial configuration of the plurality of programmable tiles by reading subsequent configuration data from the memory module and writing the subsequent configuration data to the programmable integrated circuit, the subsequent partial configuration forming a subsequent application module having an additional functionality of the programmable integrated circuit and being operational upon completion of the subsequent partial configuration.

11. The electronic system of claim 8, wherein the initial application module is further configured to determine based on the input signal whether to perform a subsequent partial configuration of the plurality of programmable tiles to form a subsequent application module having an additional functionality of the programmable integrated circuit or to generate an output signal for powering down the programmable integrated circuit without performing the subsequent partial configuration.

12. The electronic system of claim 8, wherein the wherein the initial application module is further configured to generate a system device power up signal, the electronic system further comprising:
a system device power controller coupled to the programmable integrated circuit, the system device power controller configured to receive the system device power up signal and enable a system device power signal in response to receiving the power up signal; and
a system device coupled to the system device power controller and configured to receive the system device power signal and power up in response to receiving the system device power signal.

13. The electronic system of claim 12, wherein the system device is coupled to the programmable integrated circuit and the initial application module is further configured to generate a system device control signal for performing a system device operation.

14. The electronic system of claim 8, wherein:
the configuration module is further configured to perform a sequence of subsequent partial configurations of the plurality of programmable tiles after the initial partial configuration; and
each subsequent partial configuration of the sequence of subsequent partial configurations forms a subsequent application module having an additional functionality of the programmable integrated circuit and being operational upon completion of the subsequent partial configuration.

15. The electronic system of claim 14, wherein the initial application module is further configured to generate a configuration sequencing signal for performing the sequence of subsequent partial configurations.

16. An integrated circuit, comprising:
an initial programmable circuit;
additional programmable circuits; and
a configuration module coupled to the initial programmable circuit and to the additional programmable circuits, the configuration module being coupled to perform an initial partial configuration of the initial programmable circuit in response to an activation signal received at the integrated circuit,
wherein the initial partial configuration forms an initial application module having an initial functionality of the integrated circuit, the initial application module being operational upon completion of the initial partial configuration, and
wherein the configuration module is further coupled to perform a sequence of subsequent partial configurations of the additional programmable circuits after the initial partial configuration, each subsequent partial configuration of the sequence of subsequent partial configurations forming a subsequent application module having an additional functionality of the integrated circuit and being operational upon completion of the subsequent partial configuration.

17. The integrated circuit of claim 16, wherein the activation signal received at the integrated circuit comprises a power signal powering up the integrated circuit.

18. The integrated circuit of claim 16, wherein the initial partial configuration and each subsequent partial configuration together constitute a complete configuration of the integrated circuit.

19. The integrated circuit of claim 16, wherein the initial partial configuration and the sequence of subsequent partial configurations is included in a same configuration bitstream for the integrated circuit.

20. The integrated circuit of claim 16, wherein the initial functionality includes determining based on the input signal whether to perform a subsequent partial configuration of the additional programmable circuits to form a subsequent application module having an additional functionality of the integrated circuit or to generate an output signal for powering down the integrated circuit without performing the subsequent partial configuration.

21. The integrated circuit of claim 20, wherein the initial functionality comprises generating a power up signal for powering up an external device.

22. The integrated circuit of claim 21, wherein the external device is a system device of an automotive electrical system.

23. The integrated circuit of claim 16, wherein the initial application module is coupled to generate a configuration sequencing signal for performing the sequence of subsequent partial configurations.

* * * * *